(12) United States Patent
Rius

(10) Patent No.: US 9,279,180 B2
(45) Date of Patent: Mar. 8, 2016

(54) MACHINE FOR PLASMA TREATMENT OF CONTAINERS COMPRISING AN INTEGRATED VACUUM CIRCUIT

(75) Inventor: Jean-Michel Rius, Octeville sur Mer (FR)

(73) Assignee: SIDEL PARTICIPATIONS, Octeville sur Mer (FR)

( * ) Notice: Subject to any disclaimer, the term of this patent is extended or adjusted under 35 U.S.C. 154(b) by 1320 days.

(21) Appl. No.: 12/303,871

(22) PCT Filed: Jun. 7, 2007

(86) PCT No.: PCT/FR2007/000938
§ 371 (c)(1),
(2), (4) Date: Jul. 12, 2011

(87) PCT Pub. No.: WO2007/141426
PCT Pub. Date: Dec. 13, 2007

(65) Prior Publication Data
US 2011/0252861 A1      Oct. 20, 2011

(30) Foreign Application Priority Data

Jun. 8, 2006    (FR) ...................................... 06 05089

(51) Int. Cl.
| | |
|---|---|
| G01L 27/02 | (2006.01) |
| C23C 16/04 | (2006.01) |
| C23C 16/511 | (2006.01) |
| C23C 16/54 | (2006.01) |
| H01J 37/32 | (2006.01) |
| B05D 1/00 | (2006.01) |
| B05D 7/22 | (2006.01) |

(52) U.S. Cl.
CPC ............. *C23C 16/045* (2013.01); *C23C 16/511* (2013.01); *C23C 16/54* (2013.01); *H01J 37/32192* (2013.01); *B05D 1/62* (2013.01); *B05D 7/227* (2013.01)

(58) Field of Classification Search
USPC .................................................. 73/1.58, 1.63
See application file for complete search history.

(56) References Cited

U.S. PATENT DOCUMENTS

| | | | | |
|---|---|---|---|---|
| 4,866,640 | A * | 9/1989 | Morrison, Jr. .......... | G01L 21/30 327/513 |
| 5,808,176 | A * | 9/1998 | Chang ............................. | 73/1.58 |
| 6,568,241 | B2 * | 5/2003 | Cole ............................... | 73/1.57 |
| 6,601,432 | B1 * | 8/2003 | Ericson et al. ................. | 73/1.58 |
| 2006/0062931 | A1 | 3/2006 | Rius et al. | |

FOREIGN PATENT DOCUMENTS

| | | |
|---|---|---|
| EP | 1 652 961 A1 | 5/2006 |
| FR | 2 847 912 A1 | 6/2004 |
| WO | 94/00247 A1 | 1/1994 |

* cited by examiner

*Primary Examiner* — Robert R Raevis
(74) *Attorney, Agent, or Firm* — Sughrue Mion, PLLC

(57) ABSTRACT

A machine for plasma treatment of containers, including a chamber for receiving a container to be treated, the chamber connected to a primary vacuum circuit. A pressure sensor is connected to the chamber. There is a first mechanism for communicating the pressure sensor with the chamber; a secondary vacuum circuit dependent on the first circuit and connected to the pressure sensor; and second mechanism for communicating the pressure sensor with the secondary vacuum circuit.

7 Claims, 3 Drawing Sheets

MACHINE FOR PLASMA TREATMENT OF CONTAINERS COMPRISING AN INTEGRATED VACUUM CIRCUIT

CROSS REFERENCE TO RELATED APPLICATIONS

This application is a National Stage of International Application No. PCT/FR2007/000938, filed on Jun. 7, 2007, which claims priority from French Patent Application No. 0605089, filed on Jun. 8, 2006, the contents of all of which are incorporated herein by reference in their entirety.

The invention concerns the manufacture of containers during which their inner wall is coated with a layer comprising a barrier effect material.

Depositing barrier effect material with activated plasma in the vapor phase (PECVD: Plasma Enhanced Chemical Vapor Deposition) is a known process. Traditionally, a machine equipped with a plurality of treatment units each comprising an electromagnetic wave generator, a cavity connected to the generator and realized in a conductive material (generally metal), as well as a chamber disposed in the cavity and realized in a material (generally quartz) that is transparent to the electromagnetic waves from the generator is used.

After introducing the container (generally realized in a thermoplastic polymer material such as PET) into the chamber, a high vacuum (of a few μbars—recall that 1 μbar=$10^{-6}$ bars), needed to establish the plasma, is made inside the container, while a medium vacuum (of the order of 30 mbars to 100 mbars) is made in the chamber outside the container in order to prevent the latter from contracting under the effect of the pressure difference between the inside and the outside of the container.

A precursor gas (such as acetylene) is then introduced into the container, said precursor being activated by electromagnetic bombardment (generally 2.45 GHz low-power UHF microwaves) to change it to the cold plasma state and thereby generate species such as hydrogenated carbon (including CH, CH2, CH3) which deposits itself in a thin layer (whose thickness is traditionally between 50 and 200 nm as the case may be—recall that 1 nm=$10^{-9}$ m) on the inner wall of the container.

For further details, we may refer to European patent no. EP 1 068 032 (Sidel).

The industrial implementation of this technology has led to many difficulties, including one concerning the vacuum to which the inside of the container must be subjected in order to evacuate the air (essentially composed of oxygen and nitrogen) therefrom and whose oxygen molecules ($O_2$) would be, on the one hand, likely to react with the species generated by the plasma and, on the other hand, could also be absorbed by the barrier layer, thereby attenuating its barrier properties (which we would like to prevent).

To vacuumize the chamber, the machine generally comprises a vacuum circuit that connects the chamber to a source of suction disposed outside the machine, the vacuum circuit then comprising a watertight rotary joint.

The same source of suction may be used to vacuumize the outside and the inside of the container: the vacuum circuit then comprises a first end, which discharges outside the container when the latter is located in the chamber, and a second end discharging inside the container, with a controlled valve interposed between these two ends and arranged to seal the first end when the vacuum outside the container has reached a first predetermined value (generally between 30 mbars and 100 mbars, as we have seen), vacuumization of the inside of the container, via the second end, continuing until a second predetermined value (of a few Oars) is obtained. Such an arrangement is described in European patent EP 1 228 522 (Sidel).

To the extent that the quality of the vacuum depends, to a certain degree, on the quality of the coating, manufacturers have understood that it was necessary to equip their machine with means for controlling the pressure in the chamber, and specifically the pressure inside the container where, as we have seen, the vacuum is particularly high. This is the case for example of the machine described in European patent application No. 1 493 839 (Mitsubishi).

Several sensor technologies are suitable for this type of application. Let us cite as examples Pirani gauges, cold and hot cathode gauges, and capacitance gauges, which currently offer the best performance: their operating range, between $10^{-9}$ to $10^{-7}$ bars on the one hand, and $10^{-2}$ to 1 bar on the other hand, indeed covers the vacuum range realized in the plasma treatment chambers.

In this type of sensor, a membrane deforms elastically between two electrodes that constitute with the latter a capacitor whose capacitance varies according to the distance between the electrodes and the membrane.

This sensor being connected to the inside of the container, the membrane will necessarily be contaminated by a deposit of species generated by the plasma when the container is treated. Over the course of repeated treatments, said contamination progressively distorts the pressure measurements so that eventually one no longer knows to what cause a discrepancy noted between the measured pressure and the desired theoretical pressure is to be attributed: to a defect in the watertightness of the vacuum circuit, for example, or to a drift in the sensor itself.

The traditional remedies to these problems consist of either frequently replacing the sensors or recalibrating them regularly. Recall that calibrating a pressure sensor consists of taking a measurement with the latter of a pressure known exactly in advance, so as to set the value of the "zero" associated with the sensor, and to evaluate the dynamic response of the sensor, that is to say the change, as a function of time, of the electrical signal transmitted by the sensor during a sudden and predetermined variation in pressure. These operations, which both require stopping the machine in order to remove the sensors to replace them or to recalibrate them using a specific setup, have considerable adverse effects on the productivity of the production line.

Among others, the object of the invention is to remedy these drawbacks by proposing a machine for container treatment that allows for a sustainably reliable measurement of the vacuum (that is to say, of the low pressure) in the chamber, within the treated containers.

To that end, the invention proposes a machine for plasma treatment of containers, said machine comprising:
  a chamber for receiving a container to be treated, said chamber being connected to a primary vacuum circuit,
  a pressure sensor connected to the chamber,
  first means for communicating the pressure sensor with the chamber (for example in the form of an electromagnetic valve),
  a secondary vacuum circuit, independent of the primary circuit and connected to the pressure sensor, and
  second means for communicating the pressure sensor with the secondary vacuum circuit (for example in the form of an electromagnetic valve).

The secondary vacuum circuit preferably comprises a secondary source of integrated vacuum, separate from a primary source of vacuum of the primary circuit.

According to a first embodiment, the pressure sensor is a sensor with a single compartment, connected both to the chamber and to the secondary vacuum circuit.

The invention also proposes a method for recalibrating said sensor, according to which communication between the sensor and the chamber is closed, the sensor is put into communication with the secondary vacuum circuit, the value of the pressure in the secondary vacuum circuit is measured, and said value is assigned to a reference pressure value of the sensor.

According to a second embodiment, the pressure sensor is a differential sensor of which a first compartment is connected to the chamber and a second compartment to the secondary vacuum circuit. Third means for communicating the two compartments of the sensor are preferably provided, which are for example in the form of an electromagnetic valve interposed between the two compartments.

The invention also proposes a method for recalibrating said differential sensor, according to which communication between the sensor and the chamber is closed, the sensor is put into communication with the secondary vacuum circuit, the two compartments of the sensor are put into communication, the value of the pressure in the secondary vacuum circuit is measured using the second compartment, and said value is assigned to a reference pressure value of the second compartment. According to one embodiment, the dynamic response of the sensor is also evaluated.

Other objects and advantages of the invention will become apparent in light of the following description referring to the appended drawings in which.

Figure 1:
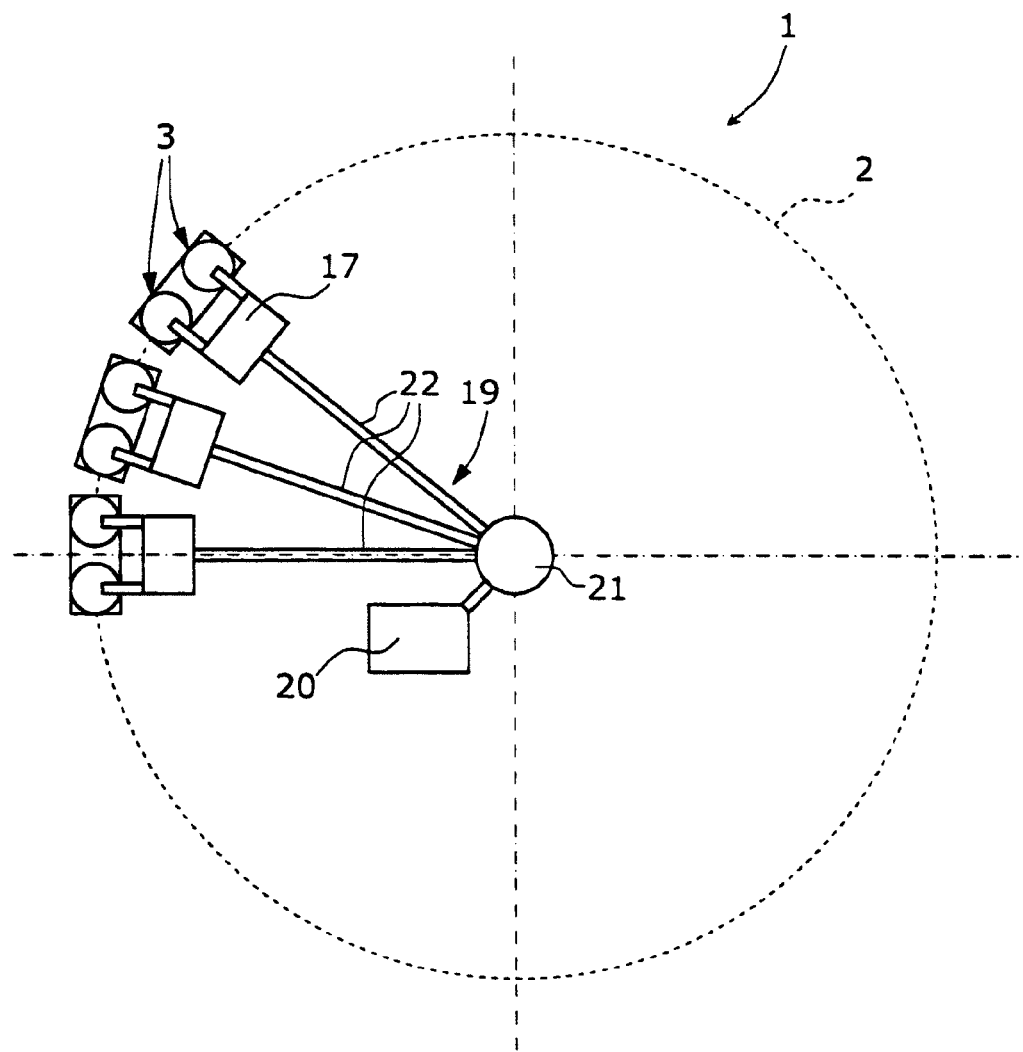
FIG. 1 is a partial schematic view showing a machine according to the invention, comprising a plurality of treatment units mounted on a same rotating carrousel.

FIG. 1 shows a machine 1 comprising a carrousel 2 on which are mounted a plurality of treatment units 3 for the plasma deposition of a barrier layer on the inner wall of containers 4 previously shaped by blow molding or stretch blow molding using a preform made of thermoplastic material such as PET.

Each treatment unit 3 comprises a generator 5 of low-power electromagnetic microwaves at a frequency of 2.45 GHz, connected by a waveguide 6 to a cavity 7 realized in a conductive material, for example made of steel or (preferably) aluminum or an aluminum alloy. In the cavity 7 is disposed a chamber 8 realized in a material for transmitting electromagnetic microwaves, such as quartz.

The cavity 7 and the chamber 8 are closed by a removable cover 9 allowing for the watertight placement of the container 4 in the chamber 8. An injector 10 for introducing a precursor gas, such as acetylene, into the container 4, crosses through the cover 9. On the cover 9 is mounted a support 11 to which the container 4 is fastened.

The machine 1 comprises a primary vacuum circuit 12 connected to each chamber 8, and that comprises a shared primary common source 13 of suction (outside the machine 1) serving both to establish a high vacuum (of a few Oars) in the container 4 before the precursor gas is introduced, and to pump the residual species at the end of the reaction via a post-discharge compartment 14 formed in the cover 9 in line with the chamber 8 and in constant communication, during treatment, with the inside of the container 4.

It should be noted that the primary source 13 of suction may also be profitably employed to establish a medium vacuum (of a few millibars) in the chamber 8 outside the container 4, for example using a valve system as described in the aforementioned European patent EP 1 228 522 (Sidel).

Figure 2:
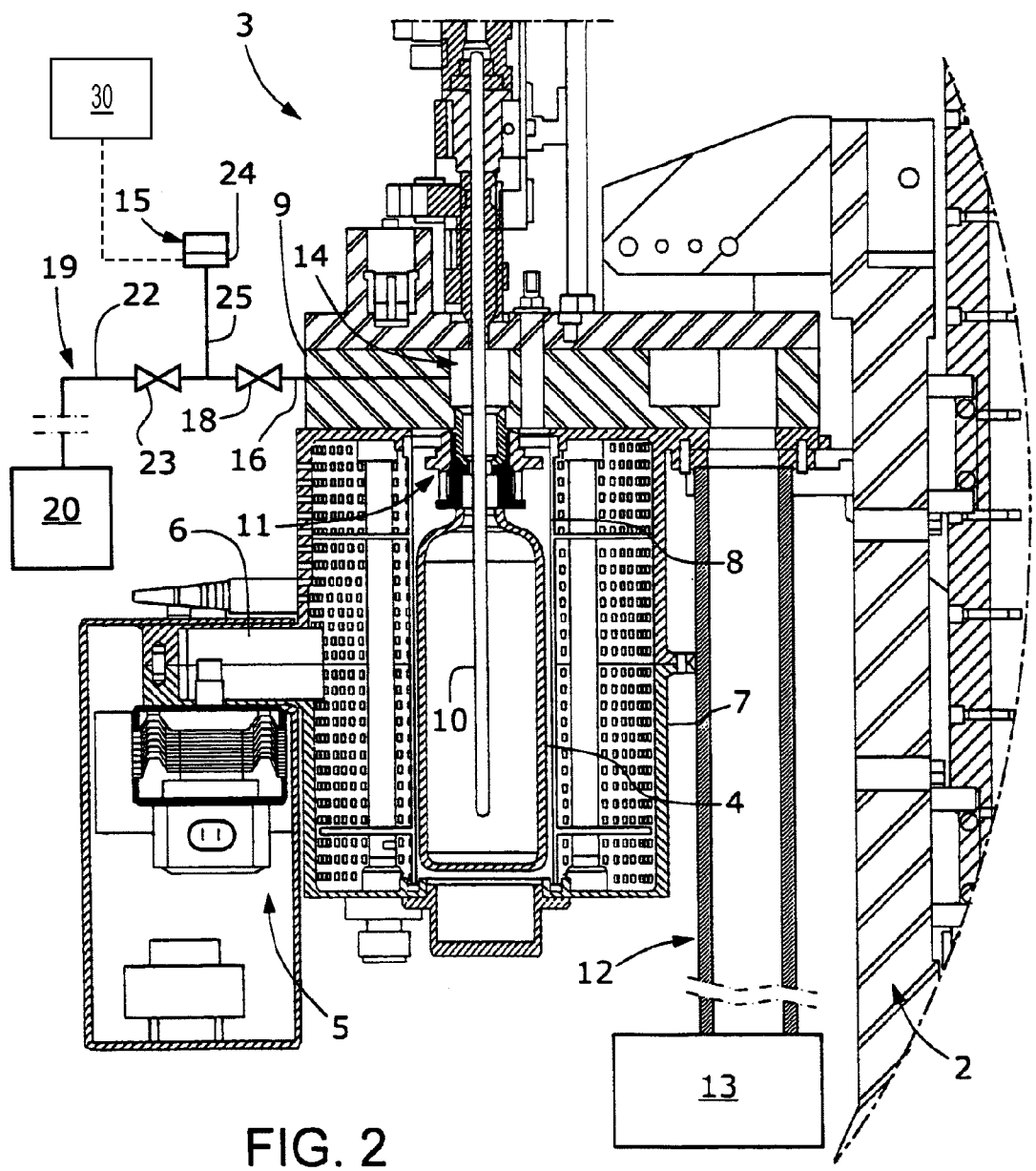
FIG. 2 is a cross-sectional elevation view showing a treatment unit equipping the machine in FIG. 1, according to a first embodiment.
Figure 3:
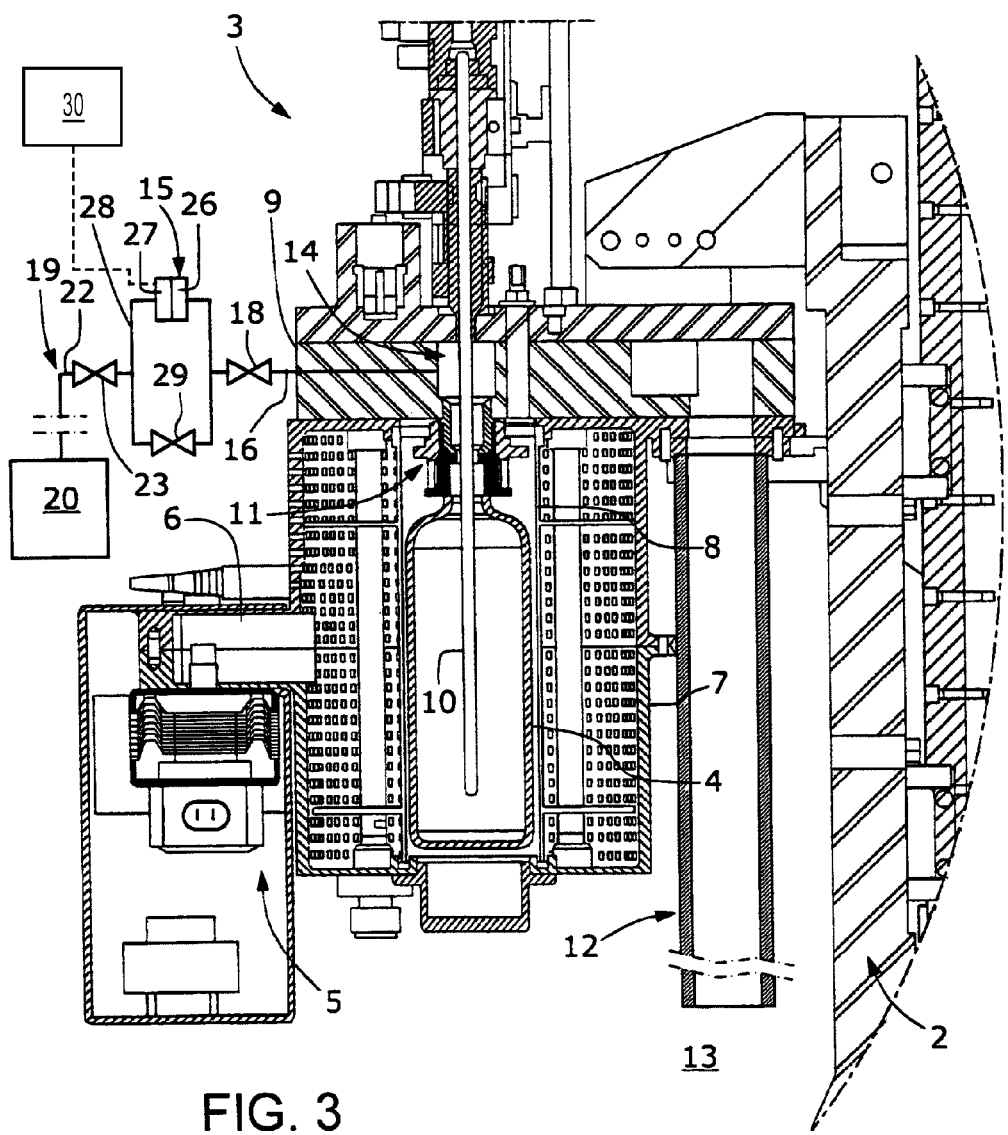
FIG. 3 is a view similar to FIG. 2, according to a second embodiment.

Each treatment unit 3 also comprises, as illustrated in FIGS. 2 and 3, a pressure sensor 15 connected to the chamber 8 through a pipe 16 ending in the post-discharge compartment 14, where the pressure is more or less the same as inside the container 4. According to one embodiment, said sensor 15 is a capacitance gauge, preferably having a measuring range of between $10^{-9}$ bars and $10^{-2}$ bars.

As shown in FIG. 1, where the treatment units 3 are grouped in pairs, said sensor 15 is mounted in a housing 17 shared by both treatment units 3 of a same pair.

A first electromagnetic valve 18 is interposed, on the pipe 16, between the sensor 15 and the post-discharge compartment 14 to allow for communication controlled by the sensor 15 with the chamber 8 (more specifically with the inside of the container 4). To prevent mechanical demand on the sensor 15 that is too great and to keep the latter in its measuring range, the electromagnetic valve 18 is preferably closed when, at the end of treatment, the cover 9 is separated from the chamber 8 (the chamber 8 and the post-discharge compartment 14 being then jointly placed in free air).

Furthermore, as shown schematically in the figures, the machine 1 comprises, in an integral fashion, a secondary vacuum circuit 19, independent of the primary circuit 12, connected to each sensor 15, and that comprises a secondary source 20 of suction, separate from the primary source 13. In practice, the secondary circuit 19, with its secondary source 20 of suction, is mounted on the carrousel 2 and thereby accompanies all the treatment units 3 in their rotation. The watertightness of the secondary vacuum circuit 19 may therefore be easily realized, which guarantees that the vacuum in the secondary circuit 19 is constant regardless of the angular position of the carrousel 2.

According to an embodiment illustrated in FIG. 1, the secondary source 20 of suction, for example a turbomolecular pump producing a vacuum between $10^{-10}$ and $10^{-6}$ bars, particularly of about $10^{-8}$ bars, is connected to a central vacuum feed tank 21 mounted in the center of the carrousel 3, this feed tank 21 being itself connected to each sensor 15 through a plurality of radial pipes 22.

As can be seen in FIGS. 2 and 3, a second electromagnetic valve 23 is interposed, on the pipe 22, between the sensor 15 and the vacuum feed tank 21 to allow for communication controlled by the sensor 15 with the feed tank 21 and, in fact, with the secondary source 20 of suction.

Two embodiments are proposed, depending upon the choice of sensor.

According to a first embodiment, shown in FIG. 2, the sensor 15 is a standard sensor, with a single compartment 24, connected, through a connecting pipe 25, to the secondary circuit 19 and to the chamber 8, which are isolated from one another by the electromagnetic valves 18, 23, which in this configuration are never open simultaneously.

During treatment, the first electromagnetic valve 18 is open, while the second electromagnetic valve 23 is closed. In that way, the sensor 15 is in communication with the chamber 8 and measures the vacuum (that is to say, the low pressure) therein. The first electromagnetic valve 18 is preferably closed when the cover 9 is opened, when the treated container 4 is emptied, and until the cover 9 is closed on the following container, so as to prevent the sensor 15 from communicating with free air.

Recall that the vacuum in the container 4 is supposed to have a predetermined value, the measurement taken by the sensor 15 being only a measurement to verify that the actual value corresponds to the theoretical value. The comparison between the actual (measured) value and the theoretical value is made within a control unit (30) outside the machine 1 and to which the sensor 15 is connected electrically.

As we mentioned in the introduction, there may be two reasons for a significant discrepancy between the two pressure values:
either a defective vacuum in the container 4, due for example to a leak in the treatment unit 3, or a malfunction of the sensor 15, whose contamination due to the deposit of species from the plasma affects performance through a progressive drift, that is to say, a growing discrepancy between the measured pressure and the actual pressure. If this drift can be corrected by computer by appropriately programming the control unit, such a correction may have the effect of concealing a vacuum defect in the chamber 8, erroneously attributed to a drift of the sensor 15.

The presence of the secondary integrated vacuum circuit 19, which provides due to its increased watertightness (due in particular to the absence of a rotary joint) a reference vacuum whose constant value is known, makes it possible to regularly recalibrate the sensor 15 by resetting its "zero" to the reference vacuum.

To recalibrate the sensor 15, the first electromagnetic valve 18 is closed, for example between two successive container treatments, and the second electromagnetic valve 23 is opened to communicate the sensor 15 with the secondary vacuum circuit 19 (that is to say, with the secondary source 20 of suction). The measured pressure value, which is equal to the reference vacuum produced by the secondary source 20 of suction (much lower than the vacuum produced by the primary source 13), is assigned within the control unit to the "zero" of the sensor 15, said zero serving as a reference for the measurements taken subsequently by the sensor 15 in the chamber 8.

The repetition of a discrepancy between the value of the vacuum measured in the container 4 by the sensor 15 and its theoretical value then shows there is a defect inherent in the machine 1 (such as a watertightness defect in the chamber 8) which requires intervention to identify the problem and remedy it.

According to a second embodiment, illustrated in FIG. 3, the sensor 15 is a differential sensor with two compartments, of which a first compartment 26 is connected to the chamber 8, and the second 27 to the secondary circuit 19, with interposition of the first electromagnetic valve 18 and the second electromagnetic valve 23, respectively.

As illustrated in FIG. 3, the two compartments 26, 27 of the sensor 15 are also connected to one another by a loop pipe 28 with interposition of a third electromagnetic valve 29 for the controlled communication of the compartments 26, 27.

During treatment, the first electromagnetic valve 18 and the second electromagnetic valve 23 are both open. The second compartment 27 is then subjected to the reference vacuum which then constantly provides the "zero" of the sensor 15, while the first 26 is subjected to the vacuum in the container 4, whose measurement is first compared with the zero defined in this manner to obtain a reliable relative value, said relative value then being compared by the control unit with the theoretical value of the vacuum that is supposed to be in the container 4.

Just as in the first embodiment, a significant discrepancy between the measured relative value and the theoretical value may be due either to a defective vacuum in the treatment unit 3, or to a malfunction of the sensor 15 due to the contamination in the first compartment 26.

Recalibration of the differential sensor 15 consists of balancing the pressure in the two compartments 26, 27 by communicating them. This rebalancing is performed at the reference pressure by closing the first electromagnetic valve 18 and by opening the second electromagnetic valve 23 and the third electromagnetic valve 29.

The "zero" of the first compartment is thereby reset to the "zero" of the sensor 15 provided by the value of the reference vacuum measured in the second compartment 27.

Just as before, the sensor 15 having been recalibrated, the repetition of a discrepancy between the value of the vacuum measured in the container 4 and its theoretical value demonstrates that the defect is not from the sensor 15 and that intervention on the machine 1 is necessary.

Regardless of the embodiment chosen, the advantages obtained by the presence of the secondary vacuum circuit 19, integrated on the machine 1 and independent of the primary circuit 12, are obvious: the provision of a reference vacuum makes it possible to recalibrate the pressure sensors of the machine 1 without disassembling them, and without stopping the machine.

Likewise, regardless of the embodiment chosen, it is preferable, during recalibration of the sensor 15, to evaluate the dynamic response of the latter, that is to say to measure the time it takes, once it is subjected to the reference pressure, to settle on the measured value. We thereby verify whether this dynamic response is fast enough to guarantee the reliability of the pressure measurements taken by the sensor 15 within the treatment unit 3.

The invention claimed is:

1. Machine for plasma treatment of containers, said machine comprising:
  a chamber for receiving a container to be treated, said chamber being connected to a primary vacuum circuit,
  a pressure sensor connected to the chamber,
  first means for communicating the pressure sensor with the chamber,
  a secondary vacuum circuit, independent of the primary circuit and connected to the pressure sensor, wherein the secondary vacuum comprises an integrated secondary source of suction, separate from a primary source of suction of the primary circuit, and
  second means for communicating the pressure sensor with the secondary vacuum circuit,
  wherein the pressure sensor is a differential sensor, of which a first compartment is connected to the chamber, a second compartment to the secondary vacuum circuit, and means for communicating the two compartments of the sensor.

2. Machine according to claim 1, wherein the means for communication are in the form of an electromagnetic valve interposed between the two compartments of the differential sensor.

3. Method for recalibrating the sensor of the machine according to claim 1, according to which communication between the sensor and the chamber is closed, the sensor is put into communication with the secondary vacuum circuit, the value of the pressure in the secondary vacuum circuit is measured, and said value is assigned to a reference pressure value of the sensor.

4. Method for recalibration according to claim 3, according to which the dynamic response of the sensor is evaluated.

5. Method for recalibrating the sensor of the machine according to claim 1, according to which communication between the sensor and the chamber is closed, the sensor is put into communication with the secondary vacuum circuit, the two compartments of the sensor are put into communication, the value of the pressure in the secondary vacuum circuit is measured by the second compartment, and said value is assigned to a reference pressure value of the second compartment.

6. The machine according to claim 1, comprising a container in the chamber; wherein the primary vacuum circuit is configured to generate a vacuum in the chamber, both outside the container and the inside the container.

7. Machine for plasma treatment of at least one container wherein a primary vacuum circuit is configured to generate a vacuum in a chamber, both outside the container and the inside the container, said machine comprising:
- said chamber for receiving a container to be treated, the chamber being connected to a primary vacuum circuit, a container in the chamber; wherein the primary vacuum circuit is configured to generate a vacuum in the chamber, both outside the container and the inside the container;
- a pressure sensor connected to the chamber,
- first means for communicating the pressure sensor with the chamber,
- a secondary vacuum circuit, independent of the primary vacuum circuit and connected to the pressure sensor, wherein the secondary vacuum circuit comprises an integrated secondary source of suction, separate from a primary source of suction of the primary vacuum circuit,
- second means for communicating the pressure sensor with the secondary vacuum circuit,
- wherein the machine comprises a control unit to recalibrate the sensor
- the pressure sensor being a single compartment sensor, the control unit closing the communication between the pressure sensor and the chamber, putting the pressure sensor into communication with the secondary vacuum circuit, measuring the value of the pressure in the secondary vacuum circuit, and assigning said value to a reference pressure value of the pressure sensor; or
- the pressure sensor being a differential sensor of which a first compartment is connected to the chamber and a second compartment to the secondary vacuum circuit, the control unit closing the communication between the pressure sensor and the chamber, putting the pressure sensor into communication with the secondary vacuum circuit such that the two compartments of the pressure sensor are put into communication, measuring the value of the pressure in the secondary vacuum circuit using the second compartment, and assigning said value to a reference pressure value of the pressure sensor, the machine comprising a third means for communicating the two compartments of the pressure sensor, the third means for communication being in the form of an electromagnetic valve interposed between the two compartments of the pressure sensor.

* * * * *